(12) United States Patent
Sumiya (10) Patent No.: US 6,741,330 B2
(45) Date of Patent: May 25, 2004

(54) EXPOSURE DEVICE

(75) Inventor: Masato Sumiya, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/390,189

(22) Filed: Mar. 18, 2003

(65) Prior Publication Data
US 2003/0227608 A1 Dec. 11, 2003

(30) Foreign Application Priority Data

Mar. 18, 2002 (JP) ......................................... 2002-074264

(51) Int. Cl.⁷ ............................. G03B 27/42; G01B 11/00
(52) U.S. Cl. ......................... 355/53; 356/400; 356/401
(58) Field of Search ............................. 355/53, 72, 75; 356/399, 400, 401

(56) References Cited

U.S. PATENT DOCUMENTS 6,384,898 B1 * 5/2002 Inoue et al. ................. 355/53
6,525,805 B2 * 2/2003 Heinle ......................... 355/53

FOREIGN PATENT DOCUMENTS

JP 10-079340 3/1998
JP 2000-147795 5/2000

\* cited by examiner

Primary Examiner—Alan Mathews
(74) Attorney, Agent, or Firm—Nixon Peabody LLP; David S. Safran (57) ABSTRACT

An exposure device in which a device for insertion or removal of the microscope for mask marks is not necessary, and in which the arrangement of the device is simplified is achieved by the provision of a microscope for mask marks in a workpiece carrier which can move in unison with the workpiece carrier. Furthermore, a reference mark is provided in the light incidence part of the microscope for determining the mask marks. The relation between the positions of the microscope for workpiece marks, the microscope for mask marks and the workpiece carrier is confirmed beforehand using this reference mark. In the positioning of the mask relative to the workpiece, the workpiece carrier is moved and the microscope for workpiece marks determines the position of the workpiece mark. Then, the workpiece carrier is moved and the microscope for mask marks determines the projection position of the mask mark. The workpiece carrier is driven such that the two agree with one another. In this way, the mask and the workpiece are positioned relative to one another.

10 Claims, 8 Drawing Sheets

EXPOSURE DEVICE

BACKGROUND OF THE INVENTION

1. Field of the Invention

The invention relates to an exposure device which has a microscope for determining mask alignment marks and a microscope for determining workpiece alignment marks and in which, using the two microscopes, positioning of the mask alignment marks and the workpiece alignment marks relative to one another is carried out. The invention relates especially to an exposure device in which the workpiece is divided into several exposure zones and which is used as an exposure device for incremental exposure of each exposure zone in a suitable manner.

2. Description of the Prior Art

In the production of a device for producing a semiconductor, a process is carried out in which a mask pattern which has been formed on a mask is exposed onto a wafer (hereinafter called a "workpiece") as the substrate which is to be treated. In this process, the following is steps are performed:

the area to be exposed on the wafer is divided into several areas;

the mask pattern is projected onto the above described areas which have been produced by division;

a workpiece carrier on which the wafer has been seated is moved by a given amount; and the above described exposure areas which have been formed by division are moved in rows to the exposure position and incrementally exposed.

This process is generally called incremental exposure or "step and repeat" exposure. An exposure device which carries out this exposure is called an "incremental exposure device" or "stepper" (hereinafter called an "incremental exposure device").

The arrangement and operation of the above described incremental exposure device is described below using FIG. 6. In this figure, the frame and the like which support the respective material components are not shown. In the figure, a light irradiation part 10, from which exposure light emerges, has an optical system, such as a lamp 10a, a focusing mirror 10b and the like.

The exposure light emerging from the light irradiation part 10 is emitted onto a mask M on a mask carrier 11. The mask pattern which has been formed on the mask M is imaged via a projection lens 12 onto a workpiece W on a workpiece carrier 13 and exposed. On the workpiece carrier 13, there is a device 13a for movement in the X-Y directions (XY are two orthogonally intersecting axes on a plane which is perpendicular to the page of the drawing). By incrementally moving the workpiece carrier 13, the workpiece W is moved from one area to the other area, which areas are formed by division, and thus, the workpiece W is exposed. If necessary, there can be a device for moving the workpiece carrier 13 in the θ-Z direction (θ: rotation around an axis perpendicular to the X-Y plane, Z: direction of the optical axis of the exposure light). Regulation of the imaging position of the mask pattern is carried out by movement either of the mask M, the projection lens 12 or the workpiece carrier 13 in the direction of the optical axis (Z-direction).

Before exposure of the workpiece W, positioning of the mask M relative to the workpiece W is carried out in order to expose the mask pattern at a given position of the workpiece W. This positioning is carried out by determining the positions of mask alignment marks MAM formed in the mask (hereinafter called mask marks) and the workpiece alignment marks WAM formed in the workpiece W (hereinafter called workpiece marks) and by moving the mask M and/or the workpiece W such that the two marks attain a given positional relationship (for example, are aligned with one another).

Therefore, there are two microscopes 14 for determining the mask marks (hereinafter called "microscopes for mask marks") which determine the mask marks MAM, and one microscope 15 for determining the workpiece marks (hereinafter called the "microscope for workpiece marks") which determines the workpiece marks WAM.

The microscopes for mask marks 14 are positioned to be removable or insertable between the light irradiation part 10 and the mask M. The position relationship of the two microscopes for mask marks 14 is set beforehand and the coordinate systems of the two microscopes agree with one another. Normally, there are two microscopes for mask marks 14. The reason for this is to determine two mask marks MAM at the same time, to measure the deviation of the mask M in the θ direction and to correct the amount of deviation. If there is a device for extensive movement of the microscope for mask marks 14 in the X-Y directions, only one microscope for mask marks 14 is sufficient. However, the mask carrier 11 is normally not made such that it can move to a large extent. If it is made such that it can move to a large extent, the precision of the movement is problematical and the arrangement of the devices complicated. Therefore, normally two microscopes for mask marks 14 are used.

In the microscope for mask marks 14, there is an alignment light source 14a which emits alignment light. The alignment light is reflected via the mask M and the projection lens 12 by workpiece W or by the workpiece carrier 13 when the mask M is present, and via the mask M if again the mask M and projection lens 12 are present, enters the CCD camera 14b of the microscope for mask marks 14.

The microscope for workpiece marks 15 is located integrally with a projection lens 12. In the microscope for workpiece marks 15, there is also an alignment light source 15a which emits alignment light. The alignment light is reflected by the workpiece W or the workpiece carrier 13 and enters the CCD camera 15b of the microscope for workpiece marks 15. Here, it is assumed that, with respect to the X-Y directions of motion of the workpiece carrier 13, there is square parallelism of the X-Y coordinates of the two microscopes 14 for the mask marks and of the microscope 14 for the workpiece marks 15. The pictures which have been received by the CCD cameras 14b, 15b, which are located in the microscopes 14, 15, are sent to a controller 16. The controller 16 acquires the position information of the respective mark by image processing of the determined mask marks MAM or the workpiece marks WAM.

The sequence of positioning of the mask relative to the workpiece in the above described exposure device is described below.

(1) Base Line Correction

Figure 6:
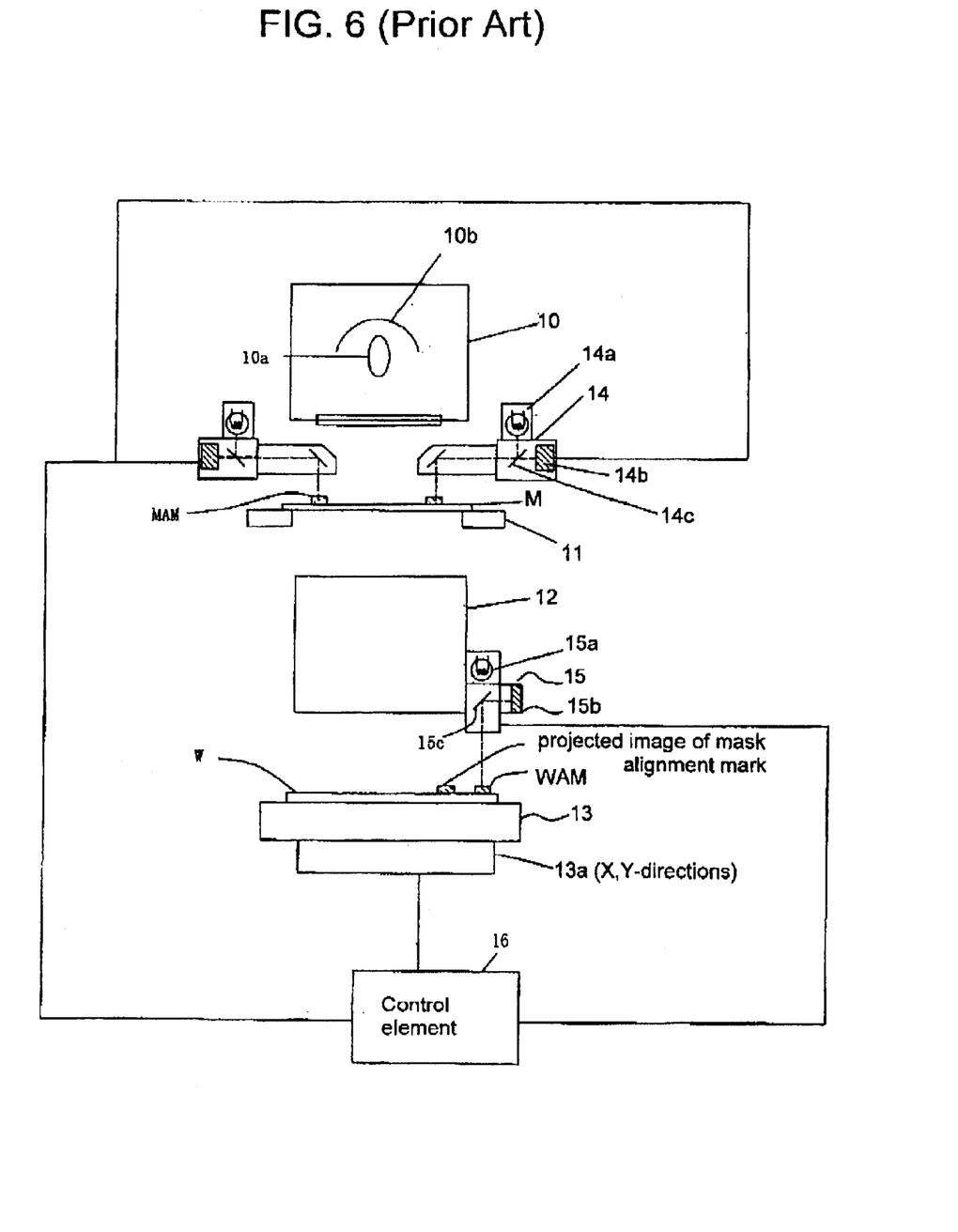
FIG. 6 shows a schematic of one example of the arrangement of a conventional exposure device.

In the exposure device shown in FIG. 6, the microscope for determining the mask marks and the microscope for determining the workpiece marks differ from one another. Therefore, the mask and the workpiece cannot be positioned relative to one another if the position relationship of the two with respect to each other is not known exactly.

Furthermore, since the positional relationship of the two with respect to one another is changed by thermal expansion which is caused by the ambient conditions and the like of the device, generally confirmation and correction must be carried out. This activity of correction of the relative positions of the microscope for mask marks 14 and of the microscope for the workpiece marks 15 relative to one another is called "baseline correction" here.

Figure 7:
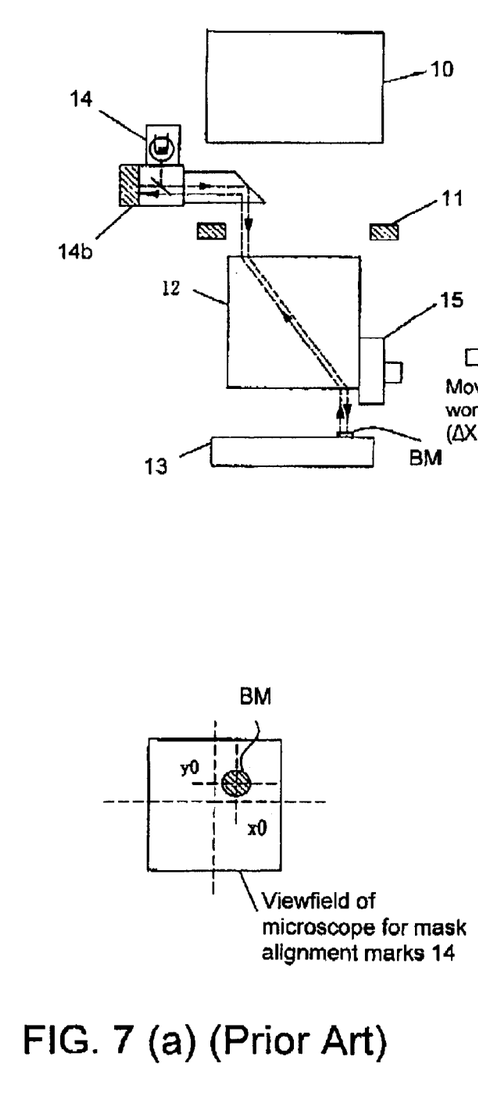

(i) As shown in FIG. 7(a), in the workpiece carrier 13 a reference mark BM (only one mark is sufficient) is formed.

(ii) The workpiece carrier 13 is moved to a preset position such that the above described reference mark BM extends into the field of vision of one of the microscopes 14 for the mask marks. The microscope for mask marks 14 emits alignment light. The reference mark BM is illuminated via the projection lens 12. The light reflected by the reference mark BM is received via the projection lens 12 by the CCD camera 14b of the microscope 14 for mask marks. FIG. 7(a) shows the reference marks BM received by the CCD camera 14b.

(iii) The reference mark image received by the CCD camera 14b is sent to the controller 16 and is subjected to image processing. Thus, the position of the microscope 14 for the mask marks is computed at the coordinates and stored in the controller 16. The position coordinates of the reference mark BM with respect to the middle of the visual field of the microscope 14 for mask marks are designated (x0, y0). The line which forms between the centers of the visual fields of the two microscopes for mask marks is located parallel to the direction of the X-axis or the Y-axis of the workpiece carrier 13. It need not be asked which of the microscopes is used for the mask marks.

(iv) Then, as shown in FIG. 7(b), the workpiece carrier 13 is moved such that the reference mark BM extends into the visual field of the microscope 15 for the workpiece marks. The amount ($\Delta X0$, $\Delta Y0$) of this motion of the workpiece carrier 13 is determined beforehand as computed data based on the position of the visual field of the microscope 14 for mask marks and based on the position of the visual field of the microscope 15 for the workpiece marks.

(v) The reference mark BM is determined with the microscope 15 for the workpiece marks. The microscope 15 for the workpiece marks emits alignment light, by which the reference mark BM is illuminated. The light reflected by the reference mark BM is received by the CCD camera 15b of the microscope 15 for the workpiece marks. In FIG. 7(b) the reference mark BM received by the CCD camera 15b is shown. The determined reference mark BM is sent in the above described manner to the controller 16 and is subjected to image processing. The position of the reference mark BM at the coordinates of the microscope 15 for the workpiece marks is computed and stored in the controller 16. The position coordinates of the reference mark BM with respect to the center of the visual field for the microscope 15 for workpiece marks are designated here by (x1, y1).

(vi) The difference $\Delta x = x0 - x1$, $\Delta y = y0 - y1$ between the position (x0, y0) of the reference mark in the visual field of the microscope for mask marks 14 and the position (x1, y1) of the reference mark in the visual field of the microscope for workpiece marks represents the amount of deviation between the microscope for mask marks 14 and the microscope for workpiece marks 15. This amount of deviation represents the amount of baseline correction. If, for example, $\Delta x = 0$, $\Delta y = 0$, the amount of baseline correction is 0. The microscope 14 for the mask marks and the microscope 15 for workpiece marks are moved apart here according to the above described computed data (the value which corresponds to the amount of motion ($\Delta X0$, $\Delta Y0$) of the workpiece carrier 13).

(2) Positioning of the Mask to the Workpiece

As was described above, positioning of the mask M relative to the workpiece W is performed in the manner described below after the amount of baseline correction has been determined.

Figure 8:
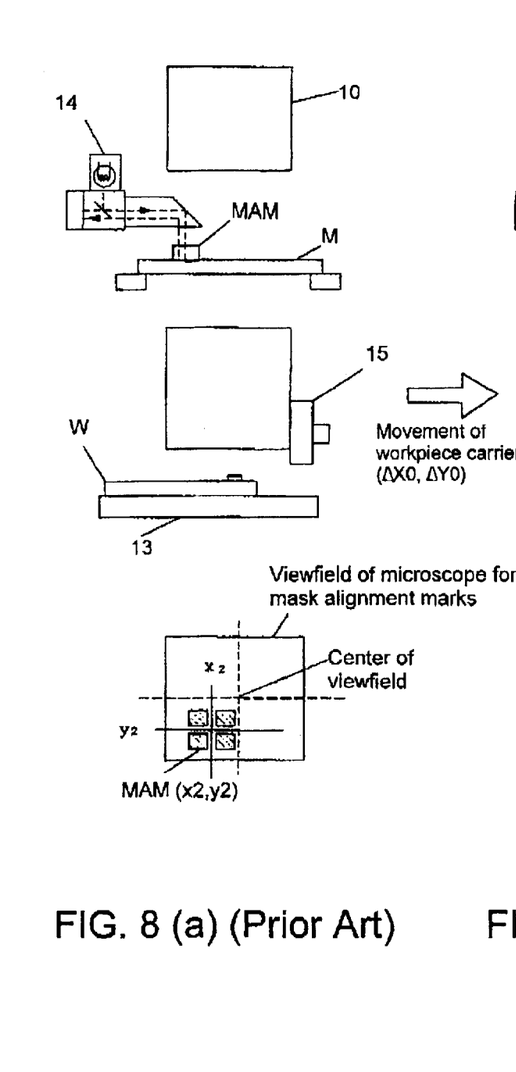

(i) As is shown in FIG. 8(a), the mask M is installed in the mask carrier 11. Furthermore, the workpiece W on which the workpiece marks WAM are formed is placed on the workpiece carrier 13.

(ii) Two microscopes for mask marks 14 are inserted (in FIGS. 8(a) & 8(b), only one microscope 14 for mask marks is shown). The mask marks MAM are determined by the two microscopes for mask marks, the mask carrier 11 is moved, correction in the $\theta$ direction is performed and two mask marks MAM are made parallel to the X axis (can also be the Y axis).

(iii) As is shown in FIG. 8(b), the workpiece carrier 13 is moved by the microscope 15 for workpiece marks to the position at which the workpiece marks WAM on the workpiece W can be determined. Alignment light is emitted onto the workpiece mark WAM by the microscope for workpiece marks 15. As was described above, the position coordinates (x3, y3) of the workpiece mark WAM are determined, the center of the visual field in the visual field of the microscope 15 for workpiece marks being regarded as the zero point. FIG. 8(b) shows the workpiece mark WAM received by the CCD camera 15b.

(iv) Then, as shown in FIG. 8(a), alignment light is emitted from the microscope 14 for the mask marks. The images of the mask marks MAM are received by the CCD camera 14b of the microscope 14 for mask marks.

(v) The mask marks MAM are subjected to image processing. The position coordinates (x2, y2) of the mask marks are computed, the center of the visual field in the visual field of the microscope 14 for mask marks being regarded as the zero point.

(vi) The amount of deviation ($\Delta X0 + \Delta x$, $\Delta Y0 + \Delta y$) of the microscope 15 for workpiece marks from the microscope 14 for mask marks is determined by the above described baseline correction. This deviation is called ($\Delta XBL$, $\Delta YBL$) below. Based on the above described amount of deviation ($\Delta XBL$, $\Delta YBL$), based on the position coordinates (x2, y2) of the mask marks MAM, the center of the visual field of the microscope 14 for mask marks being regarded as the zero point, and based on the position coordinates (x3, y3) of the workpiece marks WAM, the center of the visual field of the microscope 15 for workpiece marks being regarded as the zero point, positioning of the mask marks MAM relative to the workpiece marks WAM can be carried out. Since the middles of the visual fields of the microscope for mask marks 14 and of the microscope for workpiece marks can deviate by the amount ($\Delta XBL$, $\Delta YBL$) from one another, as was described above, the mask marks MAM in the state shown in FIG. 8(b) with respect to the workpiece marks WAM deviate by ($\Delta XBL + x2 - x3$, $\Delta YBL + y2 - y3$). As was described above, the mask M and the workpiece W can be positioned relative to one another when, proceeding from the state shown in FIG. 8(b), the workpiece carrier 13 is moved by an amount which corresponds to the amount of deviation ($\Delta XBL + x2 - x3$, $\Delta YBL + y2 - y3$). This process is carried out for each of the two workpiece marks. Two microscopes 15 for the workpiece marks can also be used. However, since the workpiece carrier 13 has the device 13a for X-Y movement, in order to carry out incremental exposure, using it, two workpiece marks can be determined in succession only by a single microscope.

(vii) After completion of positioning of the mask M relative to the workpiece W, the microscope 14 for the mask marks is removed. The mask pattern is exposed onto the workpiece W by emitting exposure light from the light irradiation part 10.

The disadvantages associated with use of an exposure device with the above described arrangement is as follows:

The microscope 14 for the mask marks must be arranged such that it can be inserted or removed between the light irradiation part 10 and the mask M. Therefore, a movement device is needed which carries out insertion or removal. The device and control are therefore complicated.

Furthermore, in general, the reproducibility of the position of the microscope for mask marks during insertion or removal is poor. The microscope for mask marks does not always return to its original position upon insertion after removal. Therefore, it is necessary to carry out the above described baseline correction each time the microscope for mask marks is inserted or removed, thus reducing the throughput.

On the other hand, if the microscope 14 for the mask marks is not inserted or removed, in baseline correction, only the deviation due to thermal expansion or the like need be taken into account. Therefore, baseline correction does not need to be done very often, thus preventing the throughput from decreasing. The microscope 14 for mask marks, however, remains inserted in the optical path from the light irradiation part 10. The area in which this microscope 14 is present becomes a shadow. This means that the effective exposure area is made smaller, and the exposure light cannot be effectively used.

SUMMARY OF THE INVENTION

The invention was devised to eliminate the above described disadvantages of the prior art. The primary objects of the present invention are to provide an exposure device in which a device for insertion or removal of the microscope for mask marks is not necessary, in which the arrangement of the device is simplified, and thus, the costs are reduced, in which, furthermore, a reduction of the throughput is prevented, and in which the effective exposure area is prevented from being reduced in size.

The above objects are achieved in accordance with the invention as follows:

(1) In an exposure device which comprises the following:
  a microscope for determining the mask alignment marks which determines the mask alignment marks which are formed on a mask;
  a microscope for determining the workpiece alignment marks which determines the workpiece alignment marks which are formed on a workpiece; and
  a controller which, as a result of the position information of the mask alignment marks which has been determined by the microscope for determining the mask alignment marks, and as a result of the position information of the workpiece alignment marks which has been determined by the microscope for determining the workpiece alignment marks, positions the mask relative to the workpiece, the above described microscope for determining the mask alignment marks is located in a workpiece carrier and is made such that it moves in one piece with the workpiece carrier, and furthermore a reference mark is located at the position which is the light incidence part of the above described microscope for determining the mask alignment marks and which can be determined by this microscope for determining the mask alignment marks and the microscope for determining the workpiece alignment marks.

(2) The exposure device described above in (1) is an incremental exposure device in which a workpiece which has been divided into several exposure zones is moved incrementally and exposed.

(3) In (1) and (2), the workpiece carrier is provided with a single microscope for determining the mask alignment marks.

(4) In (1), (2), and (3), the above described reference mark consists of frame-like light reflection components which are located in the vicinity of the visual field of the microscope for determining the mask alignment marks and which intersect orthogonally.

(5) In (4), the light reflection components are formed in the vicinity of the visual field of the above described microscope for determining the mask alignment marks by vapor deposition of a transparent part.

As was described above, in accordance with the invention, a microscope for determining mask marks is located in the workpiece carrier and there is a reference mark in its light incidence part. Therefore, a device for insertion or removal of the microscope for determining the mask marks is not necessary. Thus, the arrangement of the device can be simplified.

In the conventional device, there was the disadvantage that when the microscope for determining the mask marks is inserted or removed contaminants and the like fall on the mask and the workpiece. However, in accordance with the invention, this disadvantage does not arise because there need not be a device for insertion or removal.

Furthermore, since the microscope for determining the mask marks is moved together with the workpiece carrier, it is possible to move the microscope for mask marks using the device for moving the workpiece carrier and to determine two mask marks. Therefore, there need not be two microscopes for determining the mask marks, as was the case in the conventional example.

The invention is further described below using several embodiments shown in the drawings.

BRIEF DESCRIPTION OF THE DRAWINGS

FIGS. 2(*a*) and 2(*b*) each show a schematic of one example of a reference mark for use in accordance with the invention;

FIGS. 5(*a*) and 5(*b*) each show a schematic of positioning of the mask relative to the workpiece in accordance with the invention;

FIGS. 7(*a*) and 7(*b*) each show a schematic of the baseline correction in the conventional exposure device; and FIGS. 8(*a*) and 8(*b*) each show a schematic of positioning of the mask relative to the workpiece in a conventional exposure device.

DETAILED DESCRIPTION OF THE INVENTION

Figure 1:
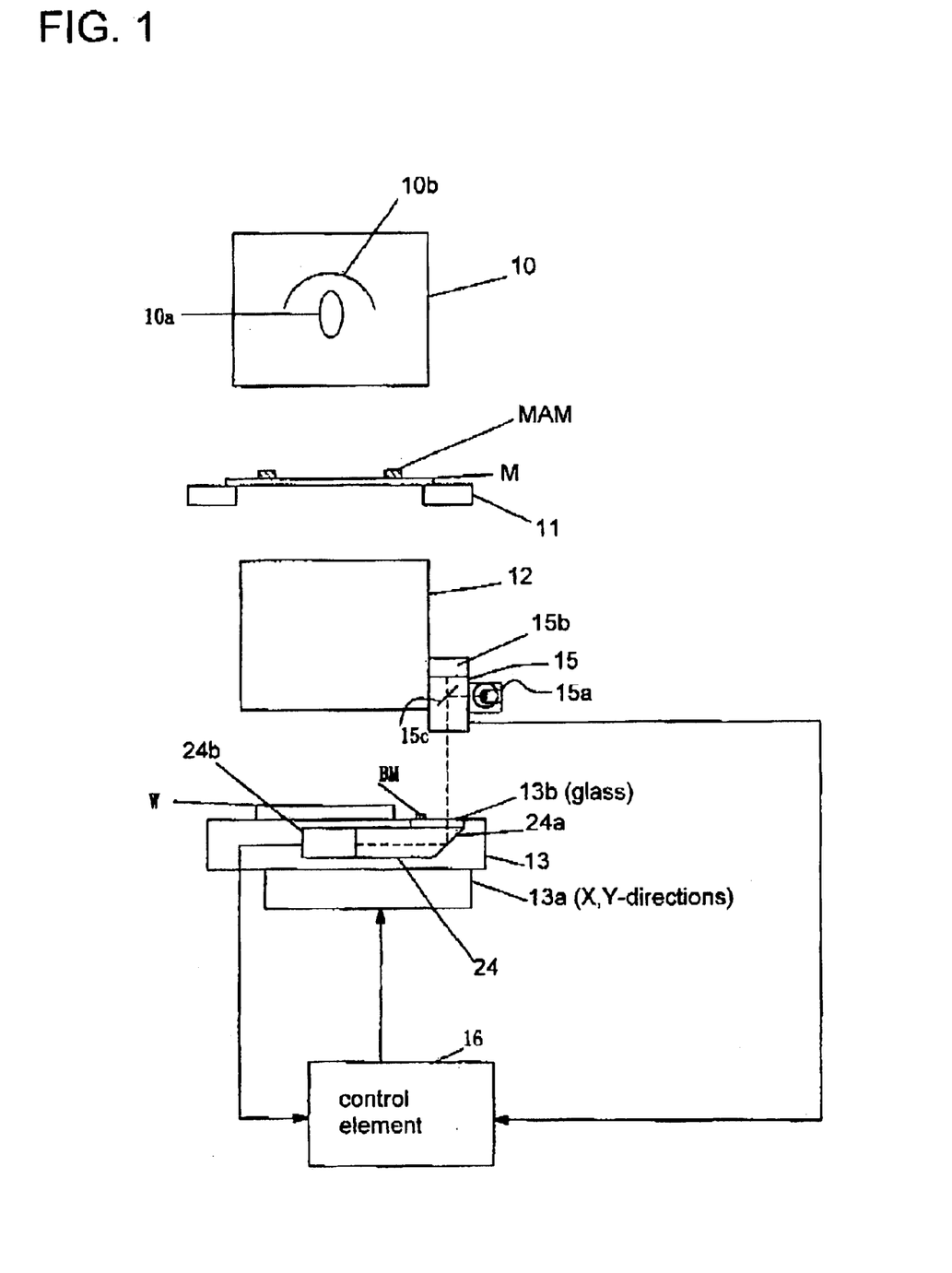
FIG. 1 shows a schematic of the arrangement of the exposure device in one embodiment of the invention.

FIG. 1 shows the arrangement of an exposure device in accordance with an embodiment of the invention. In the figure, the light irradiation part 10 has an optical system, such as a lamp 10a, a focusing mirror 10b and the like. Exposure light emerges from the light irradiation part 10 as in FIG. 6.

The exposure light emerging from the light irradiation part 10 is emitted onto a mask M on a mask carrier 11. The mask pattern which has been formed on the mask M is imaged via a projection lens 12 onto a workpiece W on a workpiece carrier 13 and exposed. On the workpiece carrier 13, there is a device 13a for movement in the X-Y directions (XY are two orthogonally intersecting axes on a plane which is perpendicular to the page of the drawing). By incrementally moving the workpiece carrier 13, the workpiece W is moved from one area to the other area, which areas are each formed by division, and thus, the workpiece W is exposed. If necessary, there can be a device for moving the workpiece carrier 13 in the θ-Z directions (θ: rotation around an axis perpendicular to the X-Y plane, Z: direction of the optical axis of the exposure light). Regulation of the imaging position of the mask pattern is carried out by movement of any one of the mask M, the projection lens 12 or the workpiece carrier 13 in the direction of the optical axis (Z direction).

Furthermore, as was described above, for positioning of the mask marks MAM relative to the workpiece marks WAM, there are a microscope for mask marks and a microscope for workpiece marks for determining the two positions.

In this embodiment, the microscope 24 for the mask marks is formed as part of the workpiece carrier 13. In FIG. 1, the microscope 24 for the mask marks is embedded in the workpiece carrier 13.

This means that, on the surface of the workpiece carrier 13, as is shown in FIG. 1, there is an opening which represents the light incidence part 13b for light incidence on the microscope 24 for the mask marks. Light from this light incidence part 13b is incident on the microscope 24 for the mask marks. The optical path of the incident light is deflected by a mirror 24a and received by a CCD camera 24b which is a light receiving element. The light irradiation part 13b is located at a point which is not covered by the workpiece W when the workpiece W is seated on the workpiece carrier 13.

In the above described light irradiation part 13b, there is a glass plate which is provided with a reference mark BM. Since the reference mark BM is located in the light incidence part 13b for light incidence on the microscope 24 for the mask marks, as was described above, the microscope 24 for the mask marks can always locate the reference mark BM. As is described below, the microscope 24 for the mask marks determines the location of the mask mark MAM which has been projected and imaged onto this glass plate and the reference mark BM at the same time.

FIG. 2(a) shows an example of a glass plate which is provided with the reference mark. The reference mark BM, in this case, is a rectangular frame which is slightly narrower than the visual field of the microscope 24 for the mask marks. This black frame is formed by vapor deposition of chromium on a glass substrate.

The visual field of the microscope 24 for mask marks accordingly becomes narrower. However, based on the edge position information of this black frame, for example, the center of mass of the black frame can be computed and called the reference position. The position of this center of mass is computed in the coordinate system of the microscope 24 for the mask marks.

FIG. 2(b) shows another example of the reference mark BM. The same action and the same effect can be obtained when it has components which are located perpendicular to one another.

The reference mark need not be formed on the glass plate, but can also be a frame body in the form of a thin plate. In this case, the images of the mask marks are projected and imaged into the air. The plane of the light incidence part 13b of the microscope 24 for the mask marks and the plane of the surface of the workpiece carrier 13 need not agree with one another, but any of the workpiece carrier 13, the projection lens 12 or the mask carrier 11 can be moved in the direction of the optical axis, and thus, the imaging position of the mask marks MAM (and of the mask pattern) can be changed.

Figure 3:
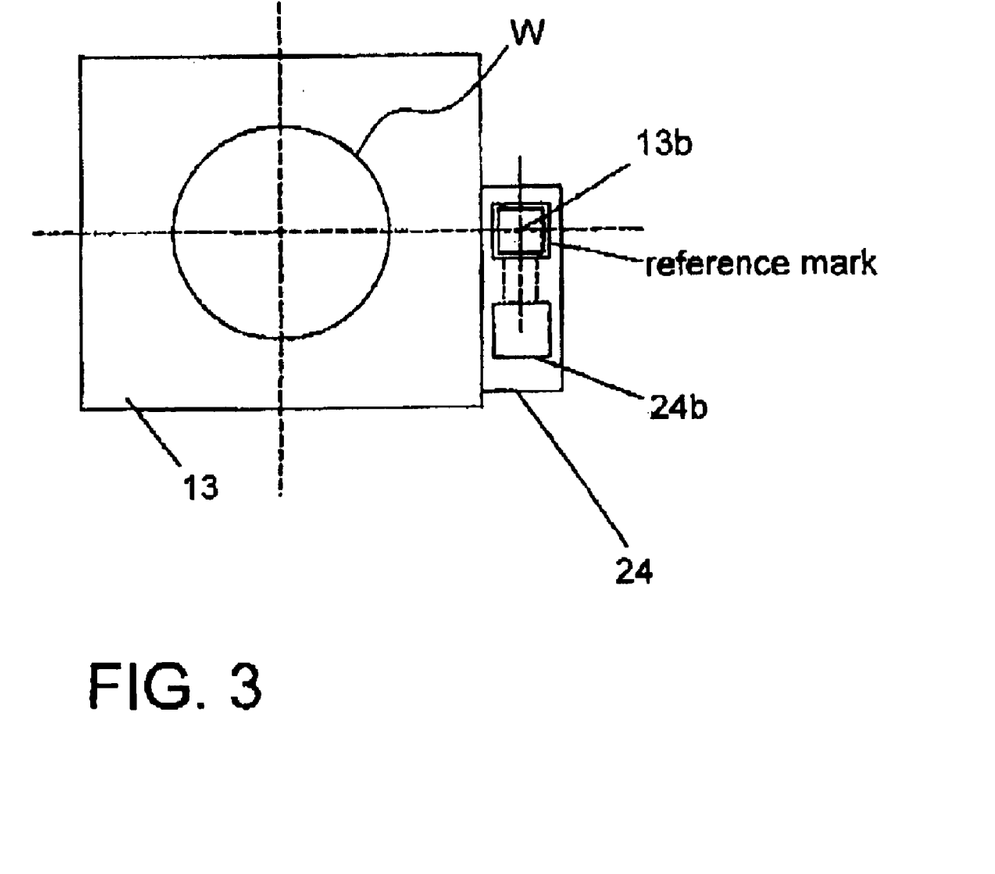
FIG. 3 shows a schematic of another installation example for a microscope for mask marks.

A case was shown above in which the microscope 24 for mask marks is installed in the workpiece carrier 13. However, the microscope 24 for mask marks can also be located, for example, on the side of the workpiece carrier 13, as is shown in FIG. 3.

On the other hand, the microscope 15 for the workpiece marks, like the microscope for mask marks described above using FIG. 6, can be as part of the projection lens 12. In the microscope 15 for the workpiece marks, there is an alignment light source 15a which emits alignment light as was shown above using FIG. 6. The alignment light is reflected by the workpiece W or the workpiece carrier 13 and is incident on the CCD camera 15b of the microscope 15 for the workpiece marks.

The images which have been received by the CCD cameras 24b, 15b, which are located in the microscopes 24, 15, respectively, are sent to the controller 16. The controller 16 acquires the position information of the respective mark by image processing of the determined mask marks MAM or the determined workpiece marks WAM.

Positioning of the mask relative to the workpiece by the above described exposure device is described below. In the exposure device in this embodiment, the microscope for determining the mask marks and the microscope for determining the workpiece marks differ from one another, as in the exposure device shown in FIG. 6, and the positional relationship of the two microscopes relative to one another is changed by thermal expansion or the like. Therefore, in general, confirmation and correction must be carried out.

However, in the device in this embodiment, since the microscope 24 for the mask marks moves in unison with the workpiece carrier 13, the positional relationship between the microscope 24 for mask marks and the microscope 15 for workpiece marks cannot be determined by the process (baseline correction) which was described in the above described conventional example.

As the activity which corresponds to the above described baseline correction, the relation between the positions of the microscope for the workpiece marks 15, the microscope 24 for the mask marks and the workpiece carrier 13 is confirmed using a reference mark BM.

This means that the position coordinates of the workpiece carrier 13 are determined beforehand when the middle position of the visual field of the microscope for workpiece marks 15 agrees with the position of the reference mark BM which is determined by the microscope for mask marks. This position is stored as the zero point position. The activity is hereinafter called "measurement of the microscope position".

Figure 4:
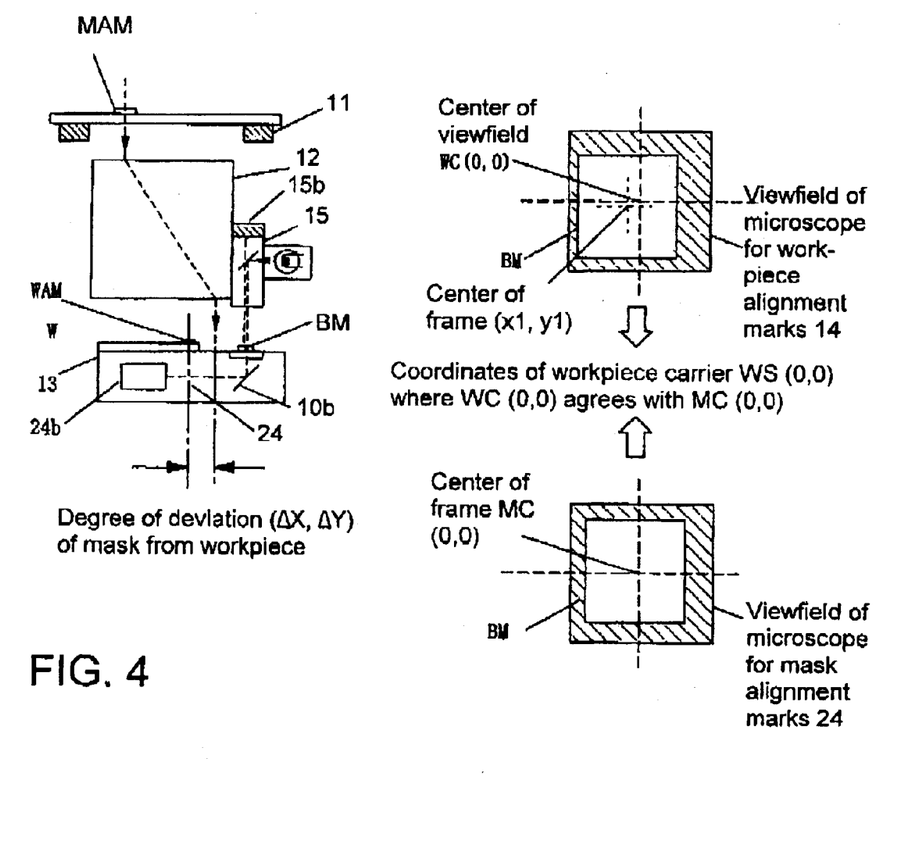
FIG. 4 shows a schematic of measuring the microscope positions in accordance with the invention.

(1) Measurement of the Microscope Position (i) As is shown in FIG. 4, the workpiece carrier 13 is moved such that the reference mark BM extends into the visual field of the microscope for workpiece marks 15. The position coordinates of the workpiece carrier 13 are called (Xw0, Yw0) here. The reference mark BM, as was shown above in FIG. 2(a), is a rectangular frame which is located in the vicinity of the visual field of the microscope for mask marks. The position of the reference mark is, for example, the middle position of the frame (called the "frame middle"). In this state, the amount of deviation of the position of the workpiece mark WAM on the workpiece W which is seated on the workpiece carrier 13 from the position of the mask mark MAM which has been projected onto the workpiece carrier 13 is labeled ($\Delta X$, $\Delta Y$), as is shown in FIG. 4. FIG. 4 shows a state in which the mask M is installed on the mask carrier 11 and the workpiece W is seated on the workpiece carrier 13. In this activity, the mask M and the workpiece W need not always be installed.

Figure 2:
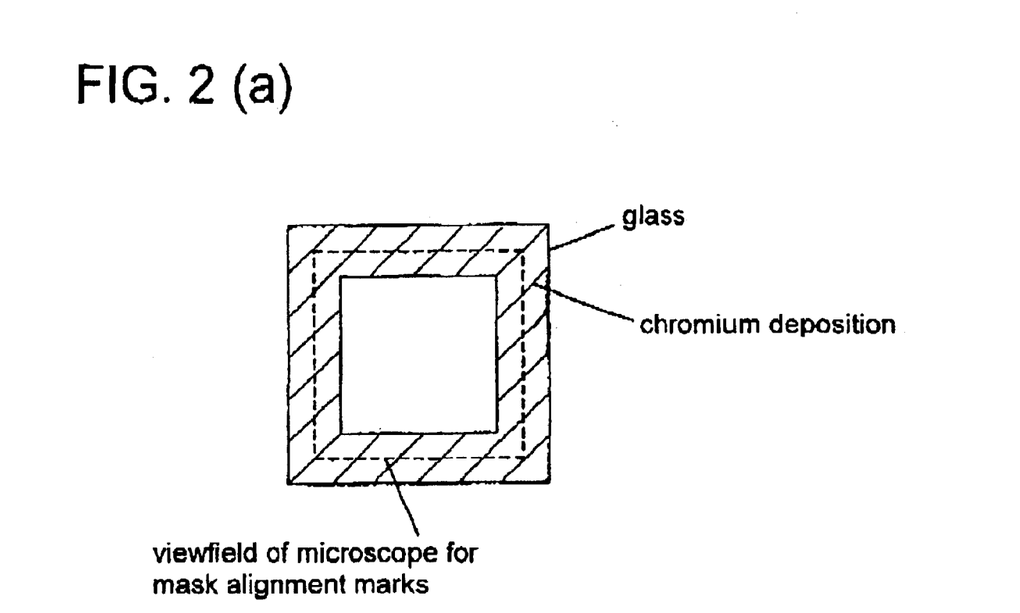

(ii) The microscope 15 for workpiece marks emits alignment light and thus the reference mark BM is illuminated. The reflection light from the reference mark BM is received and determined by the CCD camera 15b of the microscope 15 for workpiece marks. In this case the reference mark BM is the frame shown in FIG. 2 (a), as was described above. The position of the frame center is called the position of the reference mark BM. The determined images are subjected to image processing in the controller 16. Thus, the position coordinates of the reference mark BM with respect to the center of the visual field of the microscope 15 for the workpiece marks are determined. The position coordinates of the center of the visual field of the above described microscope 15 for the workpiece marks are labeled WC (0,0) and the position coordinates of the reference mark BM with respect to the above described middle of the visual field are labeled W (x1, y1).

(iii) The microscope 24 for mask marks determines location of reference mark BM. The determined images are subjected to image processing at the controller 16. Thus, the position coordinates of the reference mark BM (coordinates of the position of the frame center) of the microscope 24 for the mask marks are determined. These position coordinates are labeled MC (0, 0).

(iv) At the controller 16, the position coordinates of the workpiece carrier 13 are determined, for which WC (0,0) and MC (0,0) agree with one another. These position coordinates are stored as WS (0,0) in the controller 16. Specifically, since the reference mark BM has deviated from the center of the visual field of the microscope 15 for the workpiece marks by W (x1, y1), as was described above, the position coordinates of the workpiece carrier 13 for which WC(0,0) and MC(0,0) agree with one another are labeled (Xw0−x1, Yw0−y1). These coordinates are stored as the zero point position WS (0,0) of the workpiece carrier 13 in the above described controller 16. In this way, the activity of measuring the microscope position is completed. This activity need not be carried out each time the workpiece is treated. However, it can also be done regularly, such as once a day, as was described above, with consideration of an influence such as thermal expansion or the like.

(2) Positioning of the Mask to the Workpiece (i) The mask M on which the mask marks MAM are recorded is installed in the mask carrier 11. The workpiece W in which the workpiece marks WAM are formed is seated on the workpiece carrier 13. The workpiece carrier 13 is moved to the above described zero point position WS (0,0).

(ii) As is shown in FIG. 5(a), the workpiece carrier 13 is moved from the above described zero point position WS (0,0) by $\Delta X2$, $\Delta Y2$ so that the workpiece marks WAM extend into the visual field of the microscope 15 for the workpiece marks.

(iii) The microscope for the workpiece marks emits alignment light onto the workpiece marks WAM. The image of the workpiece marks WAM are received by the CCD camera 15b of the microscope 15 for the workpiece marks. The images of the workpiece marks WAM are subjected to image processing at the controller 16. In the visual field of the microscope 15 for the workpiece marks, the position coordinates (x2, y2) of the workpiece marks with respect to the center of the visual field are computed. The workpiece carrier 13 has been moved from the zero point position WS (0,0) by $\Delta X2$, $\Delta Y2$. However, since the center WC (0,0) of the visual field of the microscope 15 for the workpiece marks and the above described zero point position WS (0,0) agree with one another by the above described activity of measuring the microscope position, the position coordinates of the workpiece marks WAM are labeled (x2, y2), if WC (0,0) [=WS(0,0)] is called the zero point.

(iv) The workpiece carrier 13 is moved by the device 13a for X-Y motion in the X-Y directions. With respect to the other workpiece marks WAM on the workpiece, the position coordinates of the workpiece mark WAM are determined in the same manner as described above.

(v) As is shown in FIG. 5(b), the workpiece carrier 13 is moved from the above described zero point position by $\Delta X1$, $\Delta Y1$ (from the position at which the above described workpiece marks WAM have been observed by the microscope 15 for the workpiece marks, by $\Delta X1+\Delta X2$, $\Delta Y1+\Delta Y2$) so that the mask mark MAM extends into the visual field of the microscope for mask marks 24.

(vi) The light irradiation part 10 emits alignment light which illuminates the reference mark BM via the mask mark MAM and the projection lens 12. The CCD camera 24b of the microscope 24 for the mask marks receives the mask mark MAM and the reference mark BM. The images of the mask mark MAM and the reference mark BM are subjected to image processing at the controller 16. In the visual field of the microscope 24 for the mask marks, the position coordinates (x1, y1) of the mask mark with respect to the reference mark BM are computed. The coordinates of the projection position of the mask mark MAM are labeled $\Delta X1+x1$, $\Delta Y1+y1$, if WS (0,0) is called the zero point. The position coordinates of the workpiece mark WAM are labeled $\Delta X1+\Delta X2+x2$, $\Delta Y1+\Delta Y2+y2$, if WS (0,0) is called the zero point.

(vii) The workpiece carrier 13 is moved by the device 13a for X-Y motion in the X-Y directions. With respect to the other mask mark MAM which is recorded on the mask M, the coordinates of the projection position of the mask mark MAM, proceeding from the zero point W (0,0), are determined in the same manner as described above.

Figure 5:
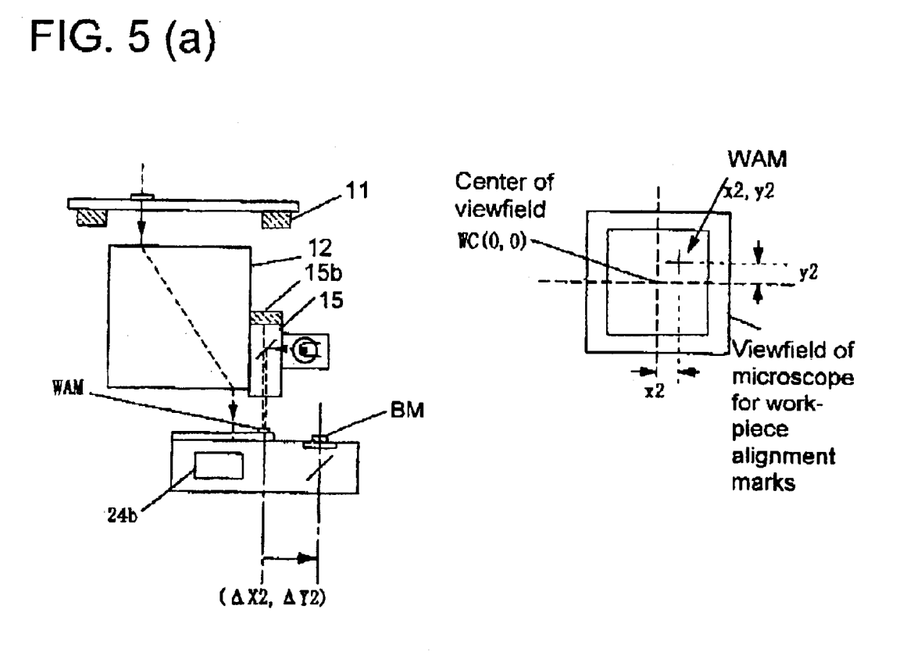

(viii) Based on the above determined projection position of the mask mark MAM and the position of the workpiece mark WAM, the difference ($\Delta X$, $\Delta Y$) between the position of the mask mark MAM and the position of the workpiece mark WAM is determined. That is, the position coordinates of the mask mark MAM in the state shown in FIG. 5(b) are labeled ($\Delta X1+x1$, $\Delta Y1+y1$), if WS (0,0) is called the zero point. The position coordinates of the workpiece mark WAM in the state shown in FIG. 5 (b) are labeled $\Delta X1+\Delta X2+x2$, $\Delta Y1+Y2+y2$, if WS (0,0) is called the zero point. When this difference is determined, the difference ($\Delta X$, $\Delta Y$) between the projection position of the workpiece mark WAM and the projection position of the mask mark MAM is called ($\Delta X2−x1+x2$, $\Delta Y2−y1+y2$). If the workpiece carrier 13, proceeding from the state shown in FIG. 5(b), is moved by ($\Delta X$, $\Delta Y$), positioning of the mask mark MAM relative to the workpiece mark WAM can be performed.

(ix) After completion of positioning of the mask relative to the workpiece, the light irradiation part 10 emits exposure light. Thus, the mask pattern is exposed onto the workpiece.

(x) The respective area on the workpiece W is incrementally exposed by moving the workpiece carrier 13 incrementally.

In the above described embodiment, an incremental exposure process is described in which the workpiece is divided into several exposure zones, and in which the workpiece is moved and exposed incrementally. However, if the workpiece carrier is moved in the X-Y-θ directions, the invention can also be used for an exposure device in which a single workpiece as a whole is exposed.

Action of the Invention (1) A device for inserting and removing the microscope for mask marks becomes unnecessary due to the arrangement of the microscope for mask marks in the workpiece carrier and of the reference mark in its light incidence part. Thus, the arrangement of the device can be simplified.

(2) Since the microscope for determining the mask marks need not be inserted or removed, a positional deviation of the microscope for determining the mask marks due to insertion or removal of the microscope for determining the mask marks is prevented from occurring. Therefore, it is unnecessary to frequently take the above described measurement of the microscope position. Thus, the throughput can be increased. In the conventional device, there was the disadvantage that, when the microscope for mask marks is inserted or removed, contaminants and the like fall on the mask and the workpiece. However, in accordance with the present invention, this disadvantage does not arise because there need not be a device for insertion or removal.

(3) Furthermore, since the microscope for determining the mask marks is moved together with the workpiece carrier, it is possible to move the microscope for mask marks using the device for moving the workpiece carrier and to determine two mask marks. Therefore, there need not be two microscopes for determining the mask marks, as was the case in the conventional example.

What we claim is:

1. Exposure device which comprises:
   a mask alignment mark microscope for determining the location of mask alignment marks formed on a mask;
   a workpiece alignment mark microscope for determining the location of workpiece alignment marks formed on a workpiece;
   a workpiece carrier which has a device for movement in X-Y-θ directions; and
   a controller means for controlling positioning of the mask relative to the workpiece from position information of the mask alignment marks which has been determined by the mask alignment mark microscope, and position information of the workpiece alignment marks which has been determined by the workpiece alignment microscope, and for controlling exposure of a mask pattern formed on the mask onto a workpiece seated on the workpiece carrier,
   wherein the mask alignment mark microscope is located in the workpiece carrier so as to be movable in unison with the workpiece carrier, wherein a reference mark is located at a position which is at a light incidence part of the mask alignment mark microscope, the location of which is determinable by the mask alignment mark microscope and the workpiece alignment mark microscope.

2. Exposure device in accordance with claim 1, wherein the exposure device is an incremental exposure device in which a workpiece which has been divided into several exposure zones is movable incrementally for exposing of the exposure zones of the workpiece.

3. Exposure device in accordance with claim 1, wherein the workpiece carrier is provided with a single microscope for determining the mask alignment marks.

4. Exposure device in accordance with claim 1, wherein the reference mark is formed of frame-shaped light reflection components which are located in the vicinity of the visual field of the mask alignment mark microscope and which are arranged perpendicular to one another.

5. Exposure device in accordance with claim 4, wherein the light reflection components are formed in the vicinity of the visual field of the mask alignment mark microscope by vapor deposition onto a transparent part.

6. Exposure device in accordance with claim 2, wherein the workpiece carrier is provided with a single microscope for determining the mask alignment marks.

7. Exposure device in accordance with claim 6, wherein the reference mark is formed of frame-shaped light reflection components which are located in the vicinity of the visual field of the mask alignment mark microscope and which are arranged perpendicular to one another.

8. Exposure device in accordance with claim 7, wherein the light reflection components are formed in the vicinity of the visual field of the mask alignment mark microscope by vapor deposition onto a transparent part.

9. Exposure device in accordance with claim 3, wherein the reference mark is formed of frame-shaped light reflection components which are located in the vicinity of the visual field of the mask alignment mark microscope and which are arranged perpendicular to one another.

10. Exposure device in accordance with claim 9, wherein the light reflection components are formed in the vicinity of the visual field of the mask alignment mark microscope by vapor deposition onto a transparent part.

* * * * *